(12) United States Patent
Kosakowski

(10) Patent No.: US 8,705,669 B2
(45) Date of Patent: Apr. 22, 2014

(54) LOW-LATENCY VITERBI SURVIVOR MEMORY ARCHITECTURE AND METHOD USING REGISTER EXCHANGE, TRACE-BACK, AND TRACE-FORWARD

(71) Applicant: Research In Motion Limited, Waterloo (CA)

(72) Inventor: Martin Kosakowski, Bochum (DE)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 13/847,208

(22) Filed: Mar. 19, 2013

(65) Prior Publication Data

US 2013/0216006 A1    Aug. 22, 2013

Related U.S. Application Data

(63) Continuation of application No. 12/713,502, filed on Feb. 26, 2010, now Pat. No. 8,433,004.

(51) Int. Cl.
*H04L 27/06*    (2006.01)

(52) U.S. Cl.
USPC ........... 375/341; 375/324; 375/360; 375/262; 375/265

(58) Field of Classification Search
USPC .......................... 375/341, 324, 360, 262, 265
See application file for complete search history.

(56) References Cited

U.S. PATENT DOCUMENTS

| | | | |
|---|---|---|---|
| 3,781,792 A | 12/1973 | Birkin | |
| 4,530,095 A | 7/1985 | Ryan | |
| 4,905,317 A | 2/1990 | Suzuki et al. | |
| 5,282,215 A | 1/1994 | Hyodo et al. | |
| 5,509,020 A | 4/1996 | Iwakiri et al. | |
| 5,606,569 A | 2/1997 | MacDonald et al. | |
| 5,796,756 A | 8/1998 | Choi et al. | |
| 5,920,597 A | 7/1999 | Khayrallah et al. | |
| 6,272,661 B1 * | 8/2001 | Yamaguchi | 714/795 |
| 6,378,106 B1 * | 4/2002 | Allpress et al. | 714/795 |
| 6,438,181 B1 | 8/2002 | Setlur et al. | |
| 6,690,754 B1 | 2/2004 | Haratsch et al. | |
| 6,732,328 B1 | 5/2004 | McEwen et al. | |
| 6,928,608 B2 | 8/2005 | Peyser et al. | |
| 7,065,702 B2 | 6/2006 | Oren | |
| 7,149,952 B2 | 12/2006 | Markman | |
| 7,246,298 B2 | 7/2007 | Chiueh et al. | |
| 7,434,150 B1 | 10/2008 | Barash | |
| 7,590,916 B2 | 9/2009 | Katashita et al. | |
| 7,979,781 B2 | 7/2011 | Pisek | |

(Continued)

OTHER PUBLICATIONS

Canadian Intellectual Property Office, Examination Report dated Jan. 17, 2013, issued in Canadian Patent Application No. 2,730,860.

(Continued)

*Primary Examiner* — Kabir A Timory
(74) *Attorney, Agent, or Firm* — Norton Rose Fulbright Canada LLP

(57) ABSTRACT

In various aspects, the disclosure describes systems and methods for decoding of convolutionally encoded signals representing, for example, telecommunications signals such as command or content signals used in digital telecommunications. In various embodiments such aspects of the disclosure provide systems and methods for improving the efficiency, speed, and power consumption of such processes by providing architectures and methods for processing various parts of the encoded data records in parallel, using multiple and optionally specially-designed, dedicated memory registers and multiplexers.

25 Claims, 11 Drawing Sheets

(56) References Cited

U.S. PATENT DOCUMENTS

| | | | |
|---|---|---|---|
| 8,402,342 | B2 | 3/2013 | Kosakowski |
| 8,433,004 | B2 | 4/2013 | Kosakowski |
| 2006/0195773 | A1 | 8/2006 | Pisek et al. |
| 2008/0112514 | A1 | 5/2008 | Pisek |
| 2009/0172504 | A1 | 7/2009 | Huang et al. |
| 2010/0054375 | A1 | 3/2010 | Lo et al. |

OTHER PUBLICATIONS

United States Patent and Trademark Office, Office Action dated Sep. 10, 2012, issued in U.S. Appl. No. 12/713,502.
Norton Rose, Response to Office Action dated Nov. 29, 2012, filed in U.S. Appl. No. 12/713,502.
United States Patent and Trademark Office, Examiner Interview Summary and Notice of Allowance dated Dec. 24, 2012, issued in U.S. Appl. No. 12/713,502.
Norton Rose, Amendment After Allowance dated Mar. 25, 2013, filed in U.S. Appl. No. 12/713,502.
United States Patent and Trademark Office, Office Action dated Jun. 28, 2012, issued in U.S. Appl. No. 12/713,600.
Norton Rose, Response to Office Action dated Sep. 20, 2012, filed in U.S. Appl. No. 12/713,600.
United States Patent and Trademark Office, Notice of Allowance, dated Oct. 26, 2012, issued in U.S. Appl. No. 12/713,600.
European Patent Office, Partial European Search Report dated Jul. 22, 2010, issued by the European Patent Office for corresponding European Patent Application No. 10154940.0.
Article by Yao Gang, Ahmet T. Erdogan, and Tughrul Arslan, Member, IEEE, entitled "An Efficient Pre-Traceback Architecture for the Viterbi Decoder Targeting Wireless Communication Applications," dated Sep. 2006. IEEE Transactions on Circuits and Systems—1: Regular Papers, vol. 53, No. 9.
Article by Richard V. Cox, Fellow IEEE, and Carl-Erik W. Sundberg, Fellow IEEE, entitled An Efficient Adaptive Circular Viterbi Algorithm for Decoding Generalized Tailbiting Convolutional Codes, dated Feb. 1994. IEEE Transactions on Vehicular Technology: vol. 43, No. 1.
Article by Matthias Kamuf, Student Member, IEEE, Viktor Owall, Memebr IEEE, and John B. Anderson, Fellow IEEE, entitled "Survivor Path Processing in Viterbi Decoders Using Register Exchange and Traceforward," dated Jun. 2007. IEEE Transactions on Circuits and Systems—11: Express Briefs, vol. 54, No. 6.
Article by Chun-Yuan Chu, Yu-Chuan Huang, and An-Yeu Wu, entitled "Power Efficient Low Latency Survivor Memory Architecture for Viterbi Decoder," dated 2008.
Matias Erny Reichl Hoffmann, Response to Partial European Search Report, issued in respect of European Patent Application No. 10154940.0, dated Dec. 6, 2010.
European Patent Office, Extended European Search Report, issued in respect of European Patent Application No. 10154940.0, dated Sep. 27, 2011.
Ross N. Williams, A Painless Guide to CRC Error Detection Algorithms, Aug. 19, 1993.
Byonghyo Shim and Jung Chul Suh, Pipelined VLSI Architecture of the Viterbi Decoder for IMT-2000, 1999.
Jae-Sun Han, Tai-Jin Kim, Chanho Lee, High Performance Viterbi Decoder Using Modified Register Exchange Methods, 2004.
Matias Erny Reichl Hoffmann, Response to Partial European Search Report, filed in European Patent Application No. 10154940.0, dated Jan. 12, 2012.
Matias Erny Reichl Hoffmann, Further Response to Partial European Search Report, filed in European Patent Application No. 10154940.0, dated Jul. 27, 2012.
United States Patent and Trademark Office, Office Action dated Apr. 4, 2013, issued in U.S. Appl. No. 13/746,561.
Shiunn-Jang Chern; Li-Da Huang, "A VLSI architecture of SMU for strongly connected Viterbi decoder," Circuits and Systems, 1994. APCCAS '94., 1994 IEEE Asia-Pacific Conference on , vol. No. pp. 200,205, Dec. 5-8, 1994.
United States Patent and Trademark Office, Notice of Allowance dated Jul. 10, 2013, issued in U.S. Appl. No. 13/746,561.
Norton Rose Fulbright, Response to Office Action dated Jun. 14, 2013, filed in U.S. Appl. No. 13/746,561.
Norton Rose, Response to Examiner's Requisition dated Apr. 29, 2013, filed in Canadian Patent Application No. 2,730,860.
Canadian Intellectual Property Office, Examiner's Requisition dated Sep. 11, 2013, issued in Canadian Patent Application No. 2,730,860.

* cited by examiner

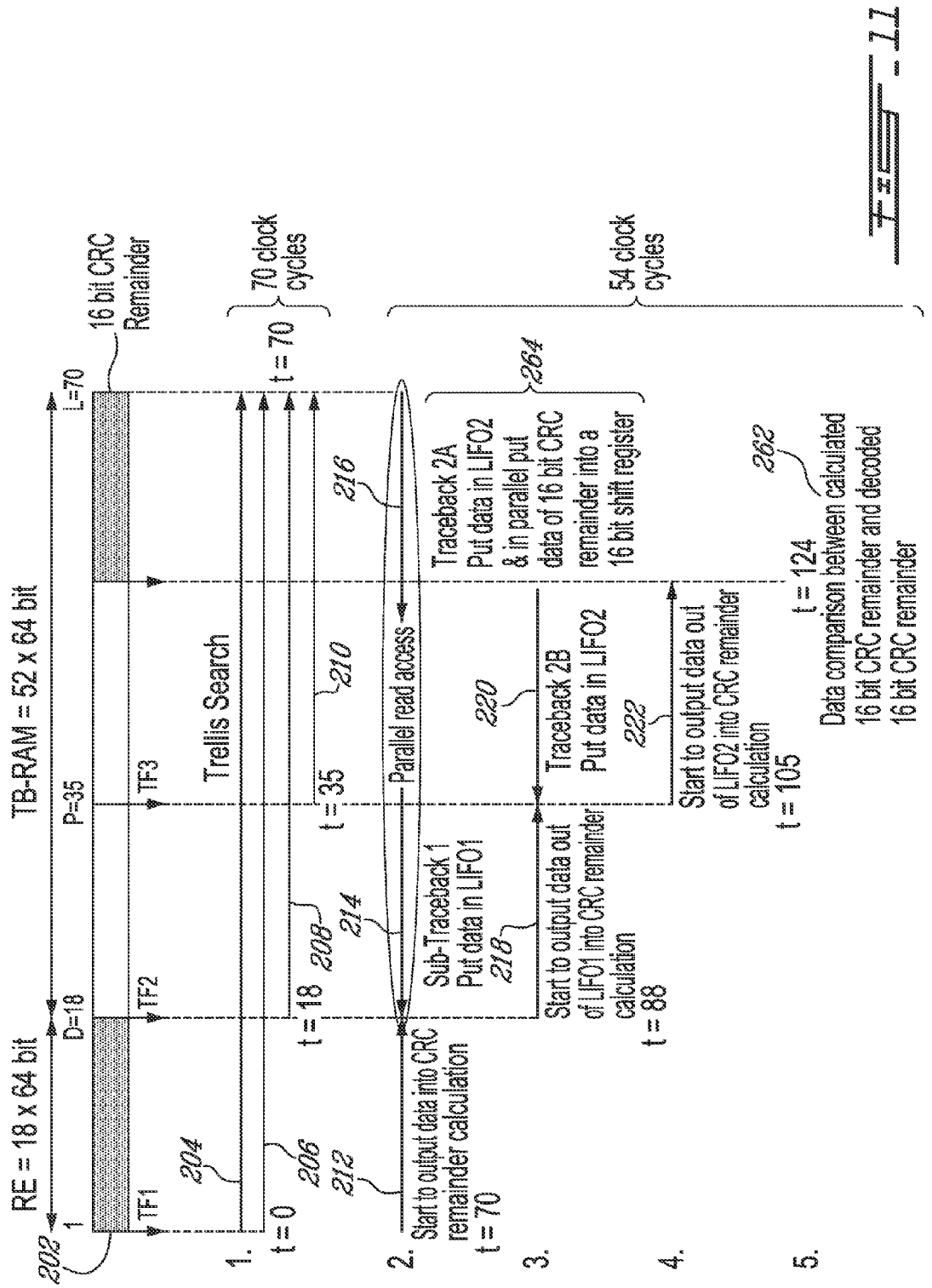

LOW-LATENCY VITERBI SURVIVOR MEMORY ARCHITECTURE AND METHOD USING REGISTER EXCHANGE, TRACE-BACK, AND TRACE-FORWARD

CROSS-REFERENCE TO RELATED APPLICATIONS

This application is a continuation of U.S. application Ser. No. 12/713,502, filed Feb. 26, 2010, now issued as U.S. Pat. No. 8,433,004, the entire contents of which are herein incorporated by reference.

FIELD

This application relates generally to telecommunications and, more specifically, to improved systems, memory architectures, and methods for processing of convolutionally encoded telecommunication data streams.

BACKGROUND

Many automated digital communication processes employ convolutional coding, as for example a means of forward error correction and/or for other purposes. Such correction can be used, for example, to make signal communication robust against undesired disturbances like noise and other signal errors.

In digital telecommunications processes, a signal to be transmitted from one terminal to another can be convolutionally encoded prior to transmission. Upon reception, the convolutionally encoded signal is typically decoded prior to further processing. Many methods of convolutionally encoding and decoding telecommunications signals using suitably-configured and -programmed data processors are known. Many such methods involve the application of the so-called Viterbi algorithm.

For example, using "register exchange" methods, Viterbi survivor paths can be stored using registers and multiplexers. In such approaches desirable numbers and configurations of connections of registers and multiplexers may be derived from a corresponding Viterbi trellis diagram, the characteristics of which in turn depend on the characteristics of generator polynomials used in the convolutional encoder, which in turn can depend upon the required robustness of the channel coding against noise and other signal disturbances, and the expected bit length of data strings to be processed.

Data records of various string lengths can be used for different purposes. For example, control signals can be employed on dedicated control channels, and can be of different bit length than content signals carried on content channels. Common lengths for control signal data records for systems currently in common use, for example for the Long Term Evolution (LTE) standard, can vary from 25 to 70 bits.

Such a register exchange process requires an array of L×N registers, where:

L=the bit length of the data strings to be processed $N=2^M=2^{(CL-1)}$=number of Trellis states CL=the constraint length of the convolutional encoder
M=CL−1=number of delay elements of the convolutional encoder The constraint length is a measure for the memory depth of the coding. It corresponds to the number of delay elements M of the convolutional encoder, plus 1. The larger the constraint length, the stronger is the protection of the information sequence to be transmitted against noise and other signal disturbances. But as the decoding complexity increases strongly (approximately quadratically) for larger constraint lengths, the practical implementation gives a strong upper bond for this value. In common current communication standards the constraint length CL is approximately 6 to 8 (e.g., for LTE, CL=7). One disadvantage of the register exchange approach is that during execution of the trellis search, simultaneous read and write access to all L×N registers is required at all times, with resultant high power consumption requirements, and corresponding short battery life in mobile systems.

As is known to those skilled in the relevant arts, "registers" suitable for use in implementing processes according to the disclosure include buffers and/or other memory(ies) immediately accessible by a processor for read and store operations. In the Application Specific Integrated Circuit (ASIC) context, one register is normally equivalent to twelve NAND gates.

Another approach to the decoding of Viterbi-encoded data has been the trace-back approach. In this type approach only N decision bits need be stored in each time step, and random access memory (RAM) can be used. However, when the trellis search has been completed, the optimal path through the trellis must be determined by applying a trace-back algorithm. This produces inverse-ordered output data, which must be processed using a last-in-first-out (LIFO) unit in order to invert the decoded output sequence. This increases latency time in processing, with resultant effects on signal and communications quality such as, for example, the ACK/NACK (Acknowledge, Non-Acknowledge) response time of a communication system. In the context of control channel information decoding, latency can be very critical, as very often the User Equipment (UE) only has to check if the base station has a message for it and if not the UE can go directly into sleep mode. The faster the control decoding can be done, the faster the decision can be made to go into sleep mode to save power, which is crucial for mobile communication devices.

In view of the several disadvantages to these approaches, hybrid techniques have been proposed. An example of such hybrid processes is the "Modified Register Exchange" (MRE) method described by Han, Kim, and Lee in ISCAS, IEEE 2004. The MRE approach divides a RAM used for storage of trellis data into Q sub-blocks, where Q depends on the desired latency for the decoding. The larger the chosen value for Q, the lower the overall decoding latency. In this type approach, Q−1 trace-forward units, each comprising an (N×M)-bit register, are required in order to track the intermediate state addresses of all N possible survivor paths at the end of each sub-block, where M is the bit width, in binary format, which is required to track N different states. Therefore, $$M=\log_2 N=\log_2(2^{CL-1})=CL-1$$

After the trellis search is completed, only a partial trace-back (a "sub-trace-back") is needed before the first decoded data sequence can be output in non-inverse order. This approach reduces the latency imposed by the pure trace-back approach, but the complexity of the processing architecture is increased, along with memory, and therefore power consumption requirements, with an inverse effect on battery life where applicable.

Thus it may be seen that the extreme efficiency requirements imposed by, for example, the need for efficient use of finite bandwidths available for the processing of large amounts of rapid signal traffic, and the limited amount of power available in battery-driven devices, mean that significant advantages stand to be gained from the optimization of systems, architectures, and methods of processing convolutionally encoded communications data streams.

As noted above, Viterbi and other convolutional coding processes suitable for use in processing streams of telecommunications data using systems and processes disclosed herein are known to those skilled in the relevant arts. Although they have not previously been modified or implemented in the manner described herein, basics of methods and processes suitable for use in decoding convolutionally encoded streams of such data, including, for example, basic trellis search processes, trace-forward processes, trace-back processes, and tail-biting processes, are also known to those skilled in the relevant arts.

BRIEF DESCRIPTION OF THE DRAWINGS

Reference will now be made, by way of example, to the accompanying drawings which show example embodiments of the present application, and in which:

FIG. 11 is a schematic diagrams of an example of a process suitable for use in implementing aspects of the disclosure Similar reference numerals may have been used in different figures to denote similar components.

DESCRIPTION OF EXAMPLE EMBODIMENTS

Figure 1:
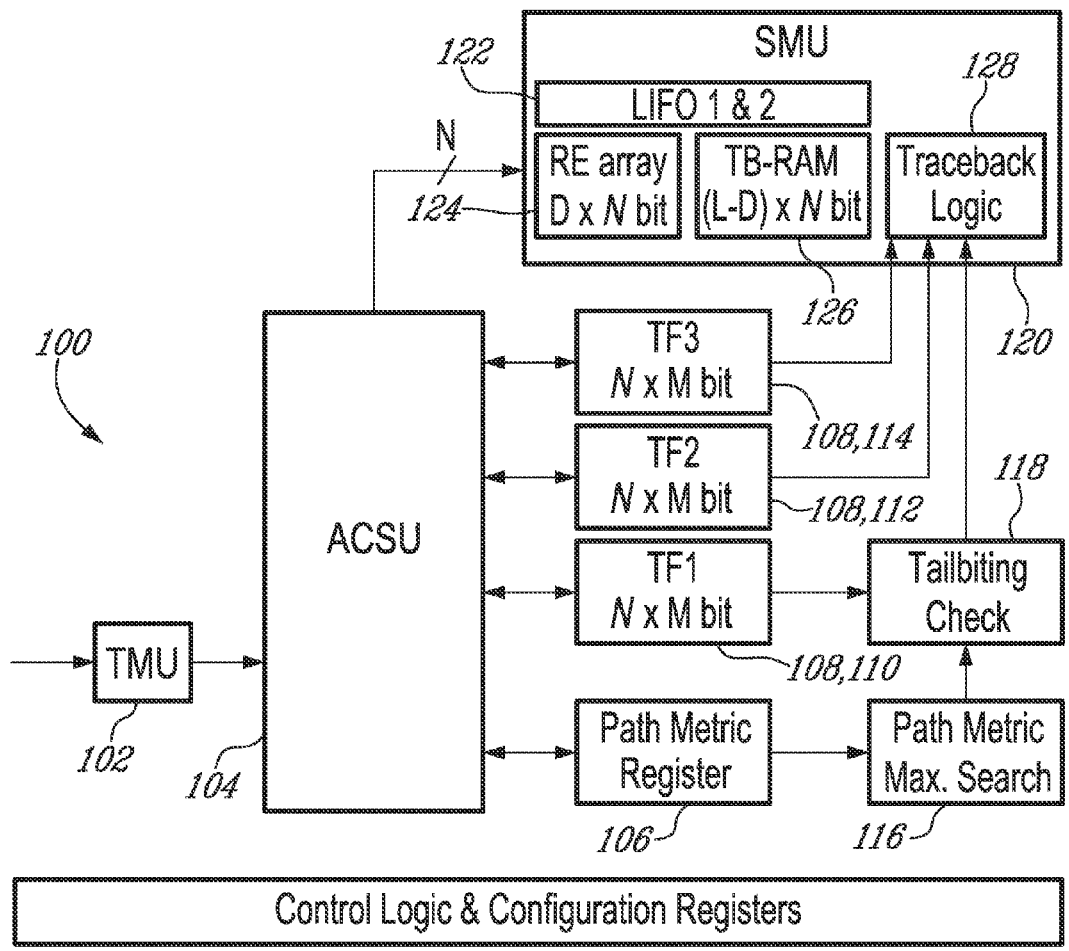
FIG. 1 is a schematic block diagram of an example of a system architecture suitable for use in implementing aspects of the disclosure.

The disclosure herein provides, in various aspects, systems and methods for decoding convolutionally encoded signals representing, for example, telecommunications signals such as command or content signals used in digital telecommunications. In various embodiments, such aspects of the disclosure provide systems and methods for improving the efficiency, speed, and power consumption of such processes by providing architectures and methods for processing various parts of the encoded data records in parallel, using multiple and optionally specially-designed, dedicated memory registers and multiplexers.

In one aspect, the disclosure provides methods, performed by data processors, for processing electromagnetic signals representing convolutionally encoded data streams of bit length L. In various embodiments, such methods can comprise, while performing a trellis search of a convolutionally encoded data record of a data stream, initiation of parallel trace-forward processes for multiple subsets of bits of the data record.

Various embodiments of methods according to such aspects of the disclosure can further include performance, by such processor(s), of parallel trace-back processes for the same or other portions of the processed data records.

Various embodiments of methods according to the disclosure can further include performance in parallel, by such processor(s), of tail-biting processes.

Methods according to the disclosure herein can further comprise storage of output related to multiple parts of any or all types of such processing in multiple registers or other electromagnetic data storage units, or memories, which memories may be volatile or persistent; and parallel output processing of results of the various search and/or trace-forward processes executed by the processor(s). In some embodiments, such methods can comprise, alternatively or in addition, parallel processing and output of tail-biting processes executed with respect to multiple portions of the processed data records.

As a specific example, in various embodiments this aspect of the disclosure provides methods, performed by data processor(s), for processing streams of electromagnetic signals representing convolutionally encoded data strings or records of known, discrete bit lengths, such methods comprising: while performing a trellis search of one or more convolutionally encoded data records of such data streams: storing decision bit data representing results of the trellis search for a first subset of bits of the data stream in a register accessible by the processor; storing decision bits representing results of the trellis search for a subsequent subset of bits of the data stream in random access memory accessible by processor; and upon completion of the trellis search for the first subset of bits of the data stream, starting parallel trace-forward processes for a plurality of subsets, which may be the same as the first and subsequent subsets, or other subsets, of the bits of the data stream.

Such methods may further comprise, in parallel with execution of such trellis searches and using information determined by at least one of the trace-forward units, checking a satisfaction of a pre-defined tail-biting criterion. If such tail-biting criterion is not satisfied, all or any portion of the trellis search may be repeated, starting with path metrics determined during the previous trellis search iteration; and if the tail-biting criterion is satisfied, initiating trace-back processing of one or more portions of the trellis search results.

In another aspect, the disclosure provides systems for processing of electromagnetic signals representing convolutionally encoded data streams. In various embodiments, such systems can comprise one or more processors configured to execute trellis searches of convolutionally encoded data strings of bit length L; at least one (D×N)-bit data register for storage of trellis search results provided by the one or more processors for the first D bits of each corresponding data string; at least one random access memory store configured for storage of the subsequent L−D bits of each corresponding data string; and a plurality of (N×M)-bit registers for storage of trace-forward data provided by the at least one processor. In some embodiments:

$D<L$;

$M=CL-1$;

$N=2^M=2^{(CL-1)}$; where

CL=the constraint length of the encoder which encoded the convolutionally encoded data; and M=number of delay elements of the encoder which encoded the convolutionally encoded data.

Various embodiments according to this aspect of the disclosure can further comprise one or more trace-back logic units configured to perform trace-back operations based on data stored in at least one of the plurality of trace-forward registers; a tail-biting check unit configured to perform tail-biting analysis using data stored in one of the trace-forward registers; and/or one or more LIFO registers for storing output from the at least one processor.

In further aspects, the disclosure provides processor- or other computer-readable programming media containing executable program structures for causing a processor or processors to perform the various processes disclosed herein. Such media can be provided in any form and/or programming language suitable for use in accomplishing the purposes disclosed herein. Such media can be provided, for example, in compiled executable command structures initially programmed in C, FORTRAN, Cobol, or other programming languages, and may be used in place of, or in addition to suitably configured hardware or firmware devices. In various embodiments of systems according to the disclosure, as described herein, processing performed by or through the use of such media can be accomplished through the use of specially-configured circuits, such as ASICs.

In further aspects, the disclosure provides systems and methods for improved cyclic redundancy checks of data records, as described herein. Such systems and methods can, as will be readily understood by those skilled in the relevant arts, be used in conjunction with various other aspects of the invention, or alone, in combination with other data processing systems and procedures.

In various embodiments of the various aspects of the disclosure, as for example in configurations intended for use in implementing telecommunications processes according to the Long Term Evolution (LTE) standard:

$$25 \leq L \leq 70 \text{ bits}$$

In various embodiments, systems and methods according to the disclosure provide improvements in the determination and provision of appropriate sizes for memory registers to be used in decoding convolutionally encoded data.

In various further embodiments, as disclosed herein, systems and methods according to the disclosure provide improvements in the processing of specific types of data, such as cyclic redundancy check (CRC) for LTE PDCCH detection.

FIG. 1 is a schematic block diagram of an example of an architecture for a system 100 suitable for use in processing convolutionally encoded signals in accordance with various aspects of the disclosure. In the example shown, system 100 comprises a transition metric unit (TMU) 102; an add-compare-select unit (ACSU) 104; path metric register 106; a plurality of trace-forward units (TFs) 108, path metric maximum search unit 116; tail-biting check unit 118; and survivor memory unit 120.

As will be understood by those skilled in the relevant arts, system 100 can be incorporated as a part of a wide variety of communications devices, including for example telecommunications devices such as wireless or voice over internet protocol (VOIP) telephones. In some embodiments, various components of system 100 can be combined into single units, particularly where, for example, specially-made circuit components are to be used.

As noted herein, systems and methods disclosed herein are suitable for processing streams of convolutionally encoded data. As will be understood by those skilled in the relevant arts, such data streams may be comprised of series or other pluralities of data records of discrete, and often pre-determined, bit length, which may be transmitted by, for example, any of a variety of known packet communications methods.

As used herein, the terms data string and data record are interchangeable, unless otherwise clearly required or implied by context.

Transition metric unit (TMU) 102 can perform any required preprocessing of incoming data sets, including for example simple additions and subtractions of incoming softbits to calculate branch metrics for the Viterbi decoder. A variety of embodiments of TMU 102 suitable for use in implementing the disclosure are known to those skilled in the relevant arts.

Add-compare-select unit (ACSU) 104 comprises a processor configured to perform at least some aspects of a trellis search of at least one convolutionally encoded data string of bit length L, including for example various aspects of the Viterbi trellis search, in particular by, firstly, adding branch metrics to path metrics; secondly, comparing the value of the relevant path metrics; and, thirdly, selecting the path metric of larger value (also called winning path metric or "survivor" path metric). A variety of embodiments of ACSU 104 suitable for use in implementing the disclosure are known to those skilled in the relevant arts. For example, some such embodiments comprise $2^M = 2^{CL-1}$ half-butterflies, where:

CL=the constraint length of the convolutional encoder

M=number of delay elements of the convolutional encoder

Path metric register 106 can be used to store metrics produced by ACSU 104 during, for example, trellis searches of convolutionally encoded data. A variety of embodiments of path metric register 106 suitable for use in implementing the disclosure are known to those skilled in the relevant arts. Path metric maximum search unit 116 can apply algorithms to find a path metric with the largest (maximum) value provided by the Viterbi trellis search. A variety of embodiments of path metric register 106 suitable for use in implementing the disclosure are known to those skilled in the relevant arts.

Trace-forward units (TFs) 108 provide correspondence between survivor paths at certain positions within the trellis path. For example, as is understood by those skilled in the relevant arts, after each Viterbi iteration (meaning one complete Trellis search), a tail-biting condition is generally checked in the case of usage of tail-biting convolutionally encoded data. When the tail-biting condition (meaning the state of path metric maximum at the end of the final survivor path is equal to the initial state of final survivor path) is fulfilled, the trace-back can be started immediately and the decoded data can be moved directly into the subsequent module.

When the tail-biting condition is not fulfilled and the maximum number of Viterbi iterations has not been reached, a next Viterbi iteration can be processed using final path metrics produced during the previous Viterbi iteration as an initial state. The maximum number of Viterbi iterations can be determined depending on latency and efficiency constraints of the communication system.

When the tail-biting condition is not fulfilled and the maximum number of Viterbi iterations has been reached, the final survivor path can in any case advantageously be moved out to the subsequent module. As will be understood by those skilled in the relevant arts, it would not in many circumstances be efficient in terms of time (latency) and resources to perform the data trace-back to find out whether the tail-biting condition is fulfilled. This can be done without introducing any latency by using an initial state register, or trace-forward register 108, in which the initial state positions of the 64 survivor paths may be saved and updated according to the ACS results all the way through the trellis.

As the selection of the survivor paths is directly reflected by changing their state positions in the trace-forward register

Figure 8:
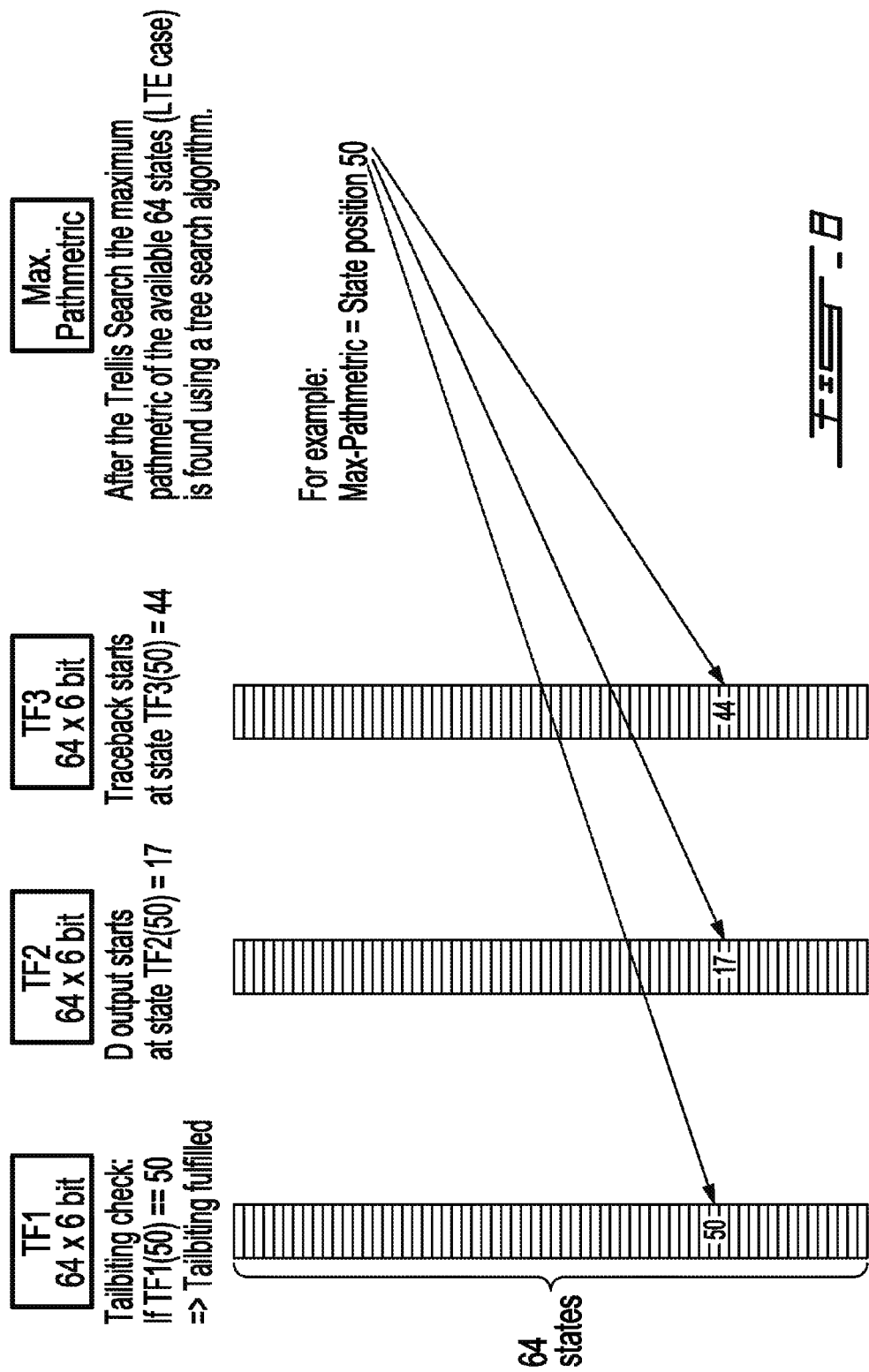
FIG. 8 is a schematic diagram of a data structure and a process suitable for use in implementing aspects of the disclosure.

108, in suitably-configured tail-biting conditions can be checked immediately after the Viterbi iteration (trellis search) without adding any extra latency. This principle is illustrated in FIG. 8.

As will be understood by those skilled in the relevant arts, once they have made themselves familiar with this disclosure, trace-forward units 108 and other components of systems and/or architectures according to the invention can be provided in any numbers, depending upon the number of portions of individual data records that are to be processed in parallel at any given point(s) in the processing of the convolutionally encoded data streams.

As is understood by those skilled in the relevant arts, decoding of convolutionally encoded data by Viterbi or other means can be performed with or without tail-biting checks. For example, in algorithms which provide block-wise decoding with a terminating tail known to the decoder, the encoder can start in a known state (usually state zero) and can terminate in the same (or a different) known state. By framing the convolutional code, an overhead (tail bits) is incurred. The convolutional code can be transmitted in a block mode with a known tail. The tail is the extra bits required to always end in a known state. An example of such an application is that used in a standard 802.11a WLAN.

In algorithms which provide block-wise decoding without known tails, tail-biting analyses can be used. For example, a frame of data can be encoded, and can begin and end with the same state, which state is however unknown to the decoder. In effect, it is as if the input data buffer is circular. In the tail-biting case the convolutional encoder can be initialized with the last $M=CL-1$ bits of the information data sequence to be transmitted (=starting state). After shifting the complete information data sequence through the convolutional encoder, the final ending state of the encoder is equal to the starting state. In the zero trellis case, the convolutional encoder is initialized with zero bits (=starting state). After shifting the complete information data sequence through the convolutional encoder the final ending state of again all zero bits is achieved only by shifting additionally $M=CL-1$ zero bits (tail bits) through the convolutional encoder. One advantage of the tail-biting method is that the overhead of the framed code with known tail can be avoided at the cost of increasing the decoding complexity. Another advantage to the framed coder which the circular coder lacks is that the bits in the data stream which are closest to the beginning and end of the frame can be better protected, since it is known that the maximum likelihood path is driven to start and stop at a known state. All bits receive the same level of protection by a circular encoder. An example of this type of application is used in the current industry development of the Long-Term Evolution (LTE) standard.

As described herein, survivor memory unit (SMU) 120 is used in the processing and storage of survivor data bits related to the decisions based on path metric comparisons of the ACSU. In the example shown, SMU 120 comprises last-in-first-out (LIFO) memory(ies) 122, comprising LIFO1 and LIFO2; register array 124; trace-back storage (RAM) 126; and trace-back logic unit 128. Components 122, 124, 126, and 128 can interact with each other and with other components, including ACSU 104, TF units 108, and tail-biting check unit 118, as described herein.

As will be understood by those skilled in the relevant arts, each of the memories, logic units, and other components of system 100 can be implemented using any suitably-configured hardware, firmware, and or software, or combinations thereof, to accomplish the purposes described herein. The examples provided herein, while representative of devices for implementing such components, are not meant to be exhaustive or otherwise limiting in any respect.

As a particular example, control logic units 102, 104, 116, 118, 120, etc., can comprise any suitable types of digital logic units, which may be configured to control Viterbi operations and other data processing as described herein. For example, a Viterbi algorithm may be implemented in one or more ASICs and/or on one or more dedicated processors to form a state machine, which ensures that all Viterbi sub-modules are synchronized with each other and that data bits are moved between modules according to desired sequences, etc. All required data handling and module control to get the Viterbi decoder running properly may be provided within the control logic unit. Such units can, in many examples, be provided using only a few kGates of digital logic. As will be understood by those skilled in the relevant arts, such units can be specially made for implementing the systems and processes described herein. Many suitable configurations are now known, and doubtless others will be developed in future. For example, ACSU 104 can comprise any suitably-configured ASIC(s) or other automatic data processor(s), programmed to execute suitably-configured encoded machine instructions using, for example, computer programming command structures programmed in any suitable programming language and stored in volatile or persistent memory accessible by the processor(s).

Alternately, or in addition, any of the logical operations provided by any of the components described herein can be executed using suitably-configured machine-readable programming instructions, such as suitably-coded and stored software instructions executable by any of the various processors provided.

Viterbi and other decoders, as is known to those skilled in the relevant arts, may be provided with built-in flexibility, in order to support for example the processing of different code rates or different numbers of softbits, etc. To ensure that a Viterbi decoder is operated in an appropriate mode, suitable configuration signals may be provided by for example a global control within an ASIC or from a control component of a processor to the Viterbi. Such configuration signals may be stored for example in configuration registers (e.g., D-flip-flops). Such registers may be provided using a few kGates of digital logic.

Figure 2:
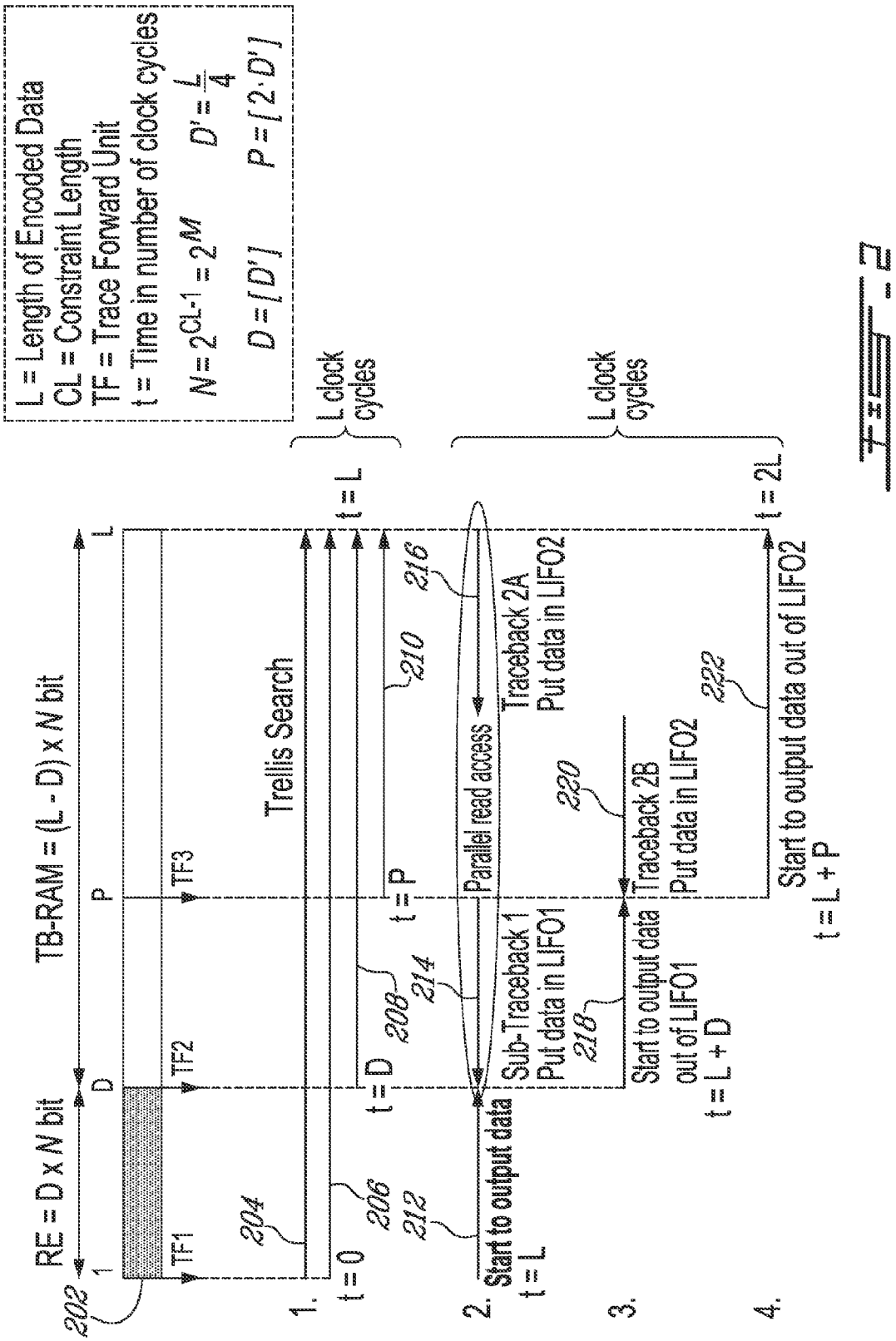
FIGS. 2-6 are schematic diagrams of examples of processes suitable for use in implementing aspects of the disclosure.

FIG. 2 is a schematic diagram of an example of a process suitable for use in implementing aspects of the disclosure herein. In the example shown, FIG. 2 illustrates a process useable in decoding set 202 of electromagnetic signals representing convolutionally encoded data streams of bit length L. The method begins at time T=0 (e.g., at the start of an initial clock cycle of the ACSU processor 104) and includes, at 204, performing a Viterbi trellis search of a convolutionally encoded data stream of bit length L. As shown in the diagram, the trellis search requires L clock cycles to complete, with a portion of the search corresponding to each bit of the data string requiring a single clock cycle. Decision bit data determined by ACSU 104 representing results of the trellis search for the first D bits of the data stream can be stored in a register 124 of SMU 120 accessible by the processor (e.g., ACSU 104), and data stored in the register array 124 can be reordered according to the latest ACSU decision. Data processed by the ACSU 104 can be provided, for example, by a TMU 102 from data received as input from a telecommunications system. Decision bits determined by the add-compare-select unit 104 representing results of the trellis search for the subsequent L–D bits of the convolutionally encoded data stream can be stored in random access memory 126 accessible by ACSU 104 or other processor.

Register array 124 can advantageously be of size D×N bits, where $0 < D' \leq L$, and preferably $L/5 \leq D' \leq L/2$; and D=round-up(D')

$N = 2^M = 2^{CL-1}$

TB-RAM 126 can advantageously be set or otherwise configured to size (L−D)×N bits.

As will be apparent to those skilled in the art, once they have made themselves familiar with this disclosure, various embodiments of the processes described herein are suitable for implementation with or without use of tail-biting processes. In embodiments in which tail-biting processing is employed, at 206 a first trace-forward unit (TF1) 108, 110 can be started at T=0, in parallel with the Viterbi trellis search at the first bit of the data string. Such first trace-forward unit (TF1) 108, 110 can be updated after each decision of the add-compare-select unit 104. Using position information determined by the first trace-forward unit 108, 110, a tail-biting criterion can be checked after completion of the trellis search (T=L), using for example known tail-biting processes and algorithms; and, if the tail-biting criterion is not fulfilled, the Viterbi trellis search 204 can be repeated, starting with the final path metrics determined during the previous iteration and stored in register 106. If the tail-biting criterion is fulfilled, output of the first D decoded bits from the register array 124 can be commenced, based on the winning state position determined by the value of the second trace-forward unit TF2, 108, 112, at the final winning state position of the trellis search, while commencing the first and second trace-back processes 214, 216.

Upon completion of the trellis search for the first D bits of the data stream, i.e., at the completion of D clock cycles of the processor 104, at 208, starting with the (D+1)$^{st}$ bit of the data string, a second trace-forward unit 108 (e.g., TF2 112), can begin a trace-forward process (which can be implemented in parallel with the Viterbi trellis search at 204 and tail-biting processing 206), and can update the second trace-forward unit output after each decision of the add-compare-select unit 104. When TF2 112 starts working, the register array 124 of D×N registers no longer needs to be updated, as the correspondence between the end of the final survivor path and its first D bits stored in the register array is given by the TF2 unit. This leads to a significant power reduction, as only M×N registers of the TF2 112 are toggling and not the D×N registers of the register array 124 anymore.

Trace-forward units 108 can be of size N×M bits.

Upon completion of the trellis search for the first P bits of the data stream, starting at clock cycle P, at 210, starting with the (P+1)$^{st}$ bit of the data string, a third trace-forward 108 unit (e.g., "TF3" 114) can be started. The third trace-forward unit 108, 114 can work in parallel with the Viterbi trellis search 204, the tail-biting check 206, and trace-forward process 208. The output of TF3 108, 114 can be updated after each decision of the add-compare-select unit 104. In such embodiments:

D=rounded-up integer value corresponding to D'
P=rounded-up integer value corresponding to 2D'

At 212, when T=L and upon completion of the Viterbi trellis search 204, processes 206, 208, 210, and successful tail-biting check 118, output of the results of the trellis search performed by ACSU 104 corresponding to the first D bits of the data stream from the register 124, based on the state position determined by the value of the second trace-forward unit 112 (TF2) at the final winning state position of the trellis search can be initiated. The decoded output data can be used, for example in providing command and/or content signals associated with a telecommunication signal to a telecommunications processor to implement a telephone call or other signal exchange.

At the same time, and in parallel to output process 212, at 214 a first trace-back process can be initiated by SMU 120, starting with state position data determined by the value of the third trace-forward unit TF3 108, 114 at the final winning state position of the trellis search. Such first trace-back process can process trellis search results corresponding to the P$^{th}$ through D$^{th}$ bits of the data stream. The decoded bits can be stored, for example in inverse order, in a first LIFO memory 122.

As will be understood by those skilled in the relevant arts, decoding processes using trace-back such as those described herein produce output in inverse sequences, as the final survivor paths are not completely visible at the end of the trellis search. Only the last single bit of the final survivor path is directly visible in the SMU. Therefore the final survivor is reconstructed bit by bit from the back of the SMU to the front. Flipping of the decoded (inverse) sequence into linear order can be accomplished using a LIFO register.

Also at T=L and in parallel to processes 212, 214, at 216 a second trace-back process can be initiated by SMU 120, starting at the final winning state position of the trellis search. Such second trace-back process can process trellis search results corresponding to the L$^{th}$ through P$^{th}$ bits of the data stream. The decoded bits can be stored, for example in inverse order, in a second LIFO memory 122.

Upon completion of the first trace-back process (e.g., at T=L+D), at 218 output of the data stored in the first LIFO memory can be commenced.

In parallel with output of data at 218, at 220 a second trace-back process can continue, following 216.

Upon completion of output at 218, at T=L+P, at 222 output of the data stored in the second LIFO memory can be commenced. The decoded output data can be used in providing command and/or content signals associated with a telecommunication signal to a telecommunications processor to implement a telephone call or other signal exchange process.

As previously noted, the process described above is suitable for implementation with or without use of tail-biting processing such as that shown at 206. In processes in which tail-biting is not used, processing can proceed as described above, without tail-biting process 206 and therefore without need for TF1 108, 110. Furthermore, in processes in which tail-biting is not used, path metric maximum search unit 116 is not required, as the final Trellis state, which is state zero in case of the most commonly used Zero-Trellis Viterbi approach, is known.

As noted in the figure, in such an embodiment processes 204, 206, 208, 210, which are performed wholly or partially in parallel, can be completed in L clock cycles. Processes 212, 214, 216, 218, 220, 222 may also be performed wholly or partially in parallel and completed in L clock cycles. Thus the entire process 202-222 can be completed in 2 L clock cycles. Compared to prior art register exchange and serial trace-back approaches, this represents an advantageous balance between latency and the amount and complexity of memory and processor architecture 100 required to decode data strings.

As noted above, Viterbi and other convolutional coding methods and processes, as well as trellis search, trace-forward, and tail-biting, and trace-back algorithms and processes, suitable for use in implementing the systems and methods disclosed herein are known in the art.

Systems and processes according to the disclosure are suitable for use with data records of any desired bit length L. It has been found, in some telecommunications applications, to be particularly advantageous to use systems and methods according to the disclosure in association with data records of bit length L of approximately 70 bits or less. In particular, as disclosed herein, the invention has been found to work with particular advantage with records of bit length L=25 up to 70 bits for PDCCH (Physical Downlink Control Channel) decoding of LTE communications.

As a particular example, embodiments of systems and methods according to the disclosure have been found to be particularly well suited to use in applications which require decoding of physical downlink control channel (PDCCH) data strings processed according to the Long-Term Evolution (LTE) standard, where, for example, a tail-biting Viterbi process is used, with a mother code rate=1/3 and a constraint length of 7.

As will be readily understood by those skilled in the relevant arts, the mother code rate is the real or natural (or inherent) code rate of a convolutional encoder without omitting any encoded data bit. For example, output from an LTE convolutional encoder is provided as 210 encoded data bits, from an information data sequence of 70 bits; as for a mother code rate of 1/3, each single input bit leads to three output bits.

The parameter D can be determined in order to optimize desired aspects of processing speed, efficiency, and storage in systems and methods according to the disclosure. In general, D≤the bit length L of the data record to be decoded. The case of D=L corresponds to the known register exchange approach described above. No trace-back is required, but large memory and processing complexity is needed. The case of D=0 corresponds to the known trace-back approach described above. Memory requirements are reduced, but latency is increased, as decoded data is first provided in inverse order and must be output serially using a single LIFO memory.

Thus in systems and methods according to the disclosure 0<D<L. Varying D between the values of 0 and L allows various aspects of the decoding process (e.g. hardware complexity and power consumption) to be optimized, depending upon the needs or objectives of a specific communications system.

In some embodiments of the invention it is of particular advantage to use a value of D corresponding to an integer, rounded-up value of D'=L/4, as shown for example in FIG. 2 and described above. In such embodiments D can be the upwardly-rounded integer value of D' obtained by dividing L by 4. For example, if L=70 and D'=L/4=17.5, then D may be rounded up to 18. P can be the integer value obtained by multiplying D' by 2.

Figure 3:
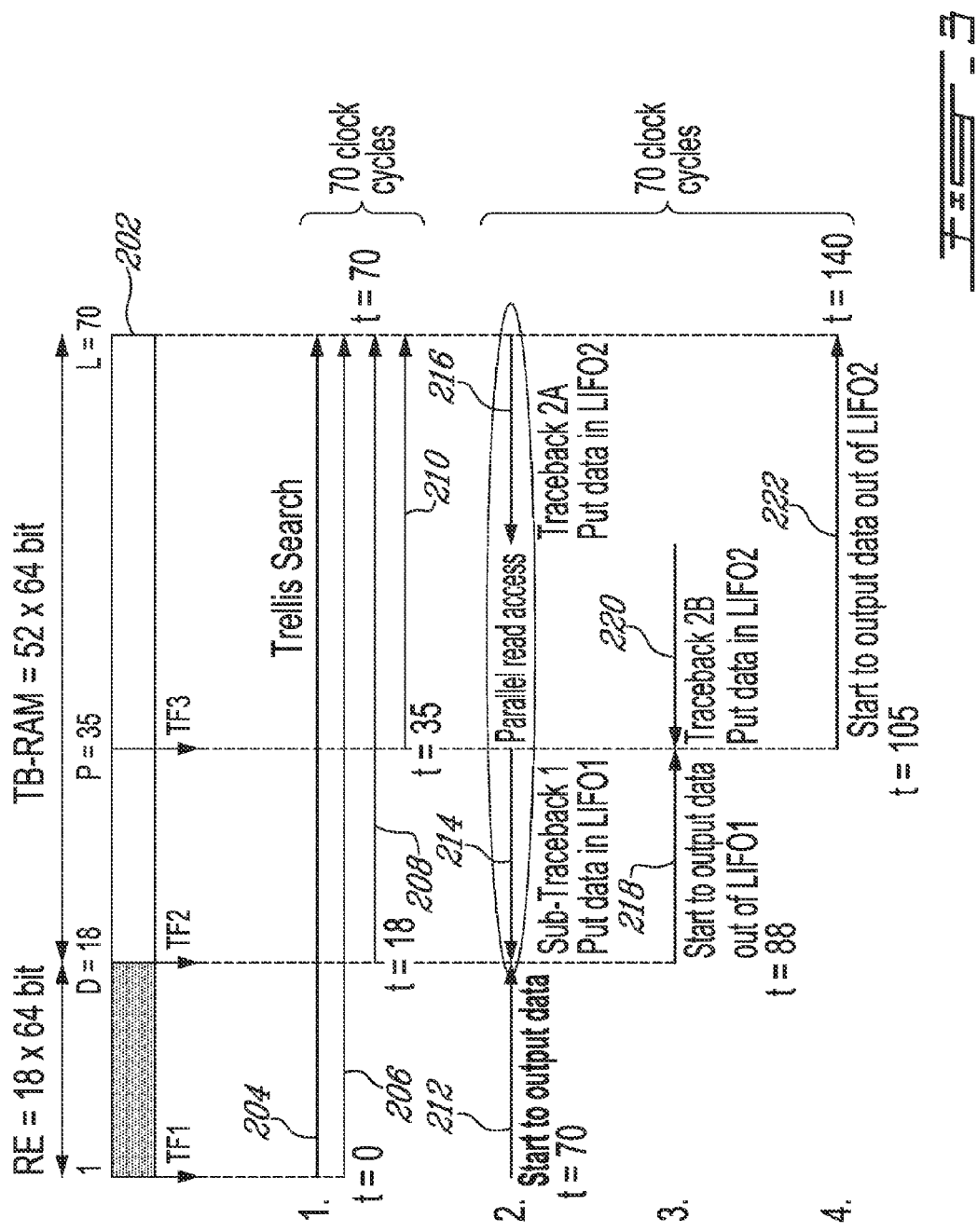

An embodiment of a process according to the disclosure corresponding to the case in which D=L/4 for decoding a data record of bit length 70 is shown in FIG. 3. Such an embodiment may be advantageously employed, for example, in decoding convolutionally encoded physical downlink control channel (PDCCH) data strings processed according to the Long-Term Evolution (LTE) standard. As shown in FIG. 3, for such a case:

$D'=L/4=70/4=17.5$ $D=\text{round-up}(D')=18$ $P=\text{round-up}(2\,D')=35$ $N=2^M=2^{CL-1}=64$ Thus a system 100 according to the disclosure can comprise a register array 124 of 18×64 bits, a TB-RAM 126 of 52×64 bits, and a plurality, preferably 3, of trace-forward units 108 of 64×6 bits each. A dual-port RAM 126 can be used, to accommodate parallel processing of two sub-traceback processes 214 and 216. Of the three trace-forward units 108 one can be used only in implementations in which tail-biting checks are employed, which is the case for example for LTE.

In the embodiment shown in FIG. 3, trellis search and storage process 204 and tail-biting process 206 (i.e., a first trace-forward process) can be started in parallel at T=0. As shown in FIG. 3, second trace-forward process 208 can commence at T=18 clock cycles. Third trace-forward process 210 can commence at T=35 clock cycles. Out process 212, and first and second trace-back processes 214, 216 can start at T=70 clock cycles. LIFO 1 output process can commence at T=88 clock cycles, and LIFO 2 output process 222 can start at T=105 clock cycles.

Thus in the embodiment shown in FIG. 3 processes 204, 206, 208, 210, which are performed wholly or partially in parallel, can be completed in L=70 clock cycles. Processes 212, 214, 216, 218, 220, 222 may also be performed wholly or partially in parallel and completed in L=70 clock cycles. Thus the entire process 202-222 can be completed in 2 L=140 clock cycles. This represents an advantageous balance between latency and the amount and complexity of memory and processor architecture 100 required to decode the data strings.

Figure 4:
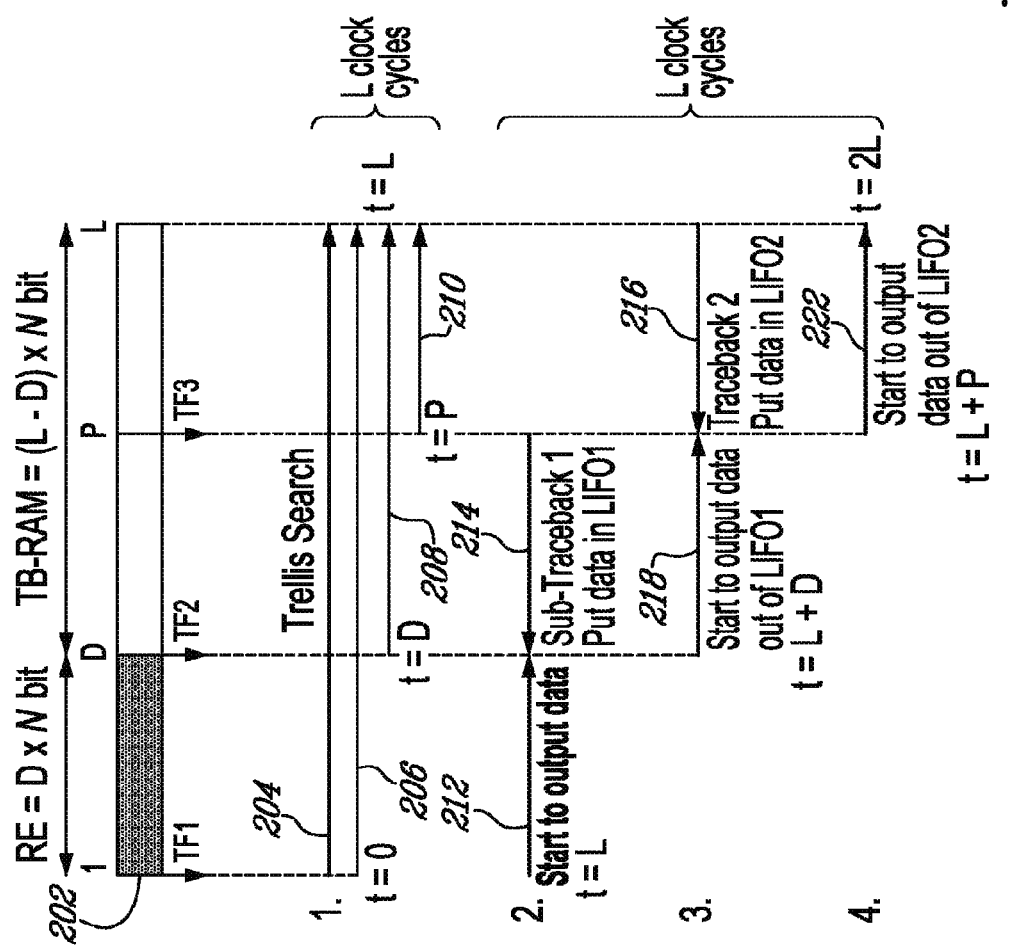

FIG. 4 shows a schematic representation of an embodiment of a system and method according to the disclosure in which D is the rounded-up integer value of D'=L/3. Because sub-trace-back process 220 is not required, only one of trace-back processes 214, 216 need be performed at a time, and a single port RAM can be employed. Three trace-forward units 108 are again employed, with one being used for tail-biting check process 206.

In the embodiment shown in FIG. 4, first trace-forward process 208 can commence at T=D clock cycles. Second trace-forward process 210 can commence at T=P=round-up (2 D') clock cycles. Output process 212 and first trace-back process 214 can commence at T=L clock cycles. LIFO 1 output process 218 and second trace-back process 216 can start at T=L+D clock cycles. LIFO 2 output process 222 can start at T=L+P clock cycles. Thus the total time required for the decoding process is again 2 L clock cycles.

Figure 5:
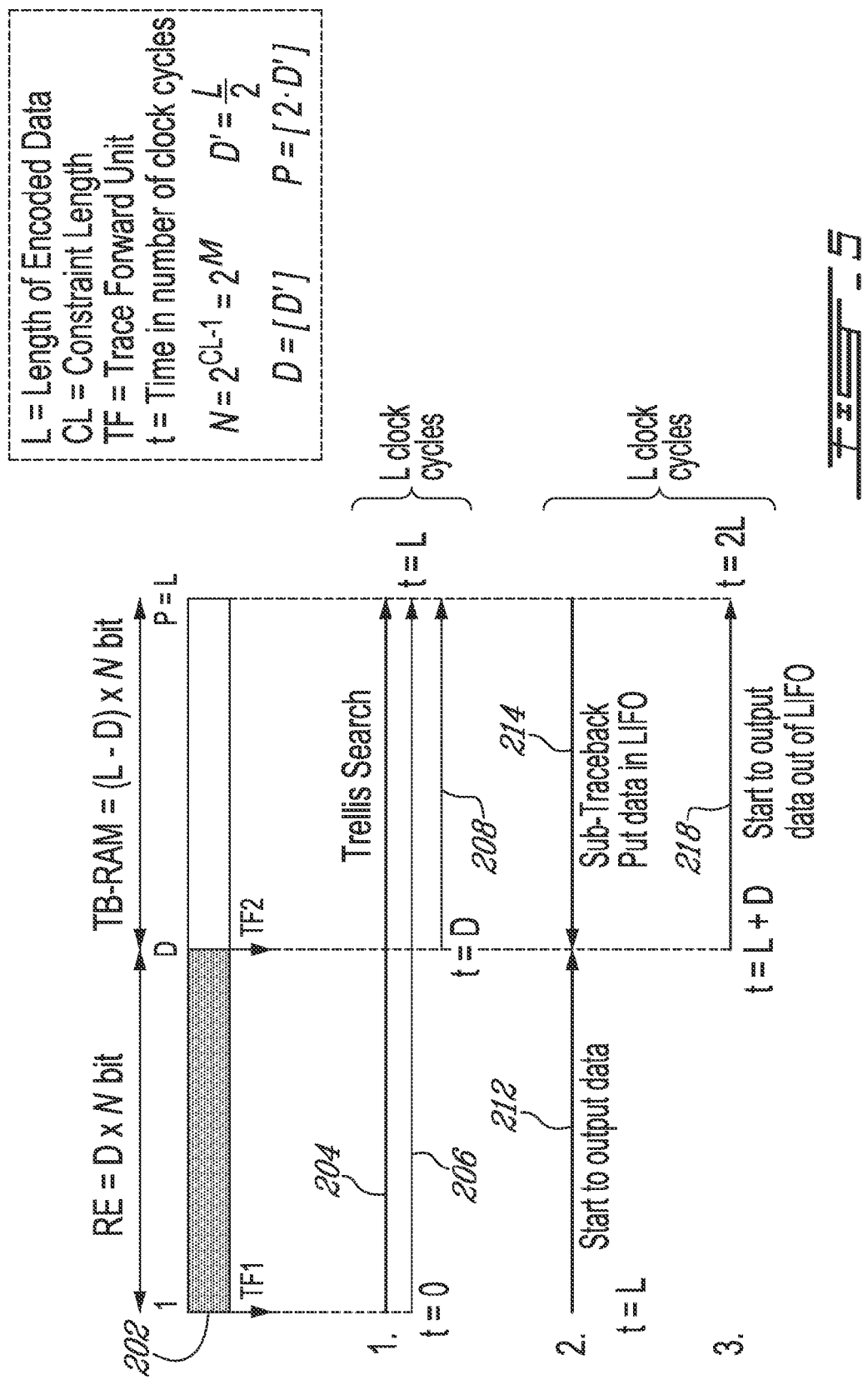

FIG. 5 shows a schematic representation of an embodiment of a system and method according to the disclosure in which D is the rounded-up integer value of D'=L/2. Only two trace-forward units 108 may be employed, with one being used for tail-biting check process 206. Only a single trace-back process 215 and a single LIFO memory are required.

In the embodiment shown in FIG. 5, trace-forward process 208 can commence at T=D clock cycles. Output process 212 and trace-back process 214 can commence at T=L clock cycles. LIFO output process 218 can start at T=L+D clock cycles. Thus the total time required for the decoding process is again 2 L clock cycles.

Figure 6:
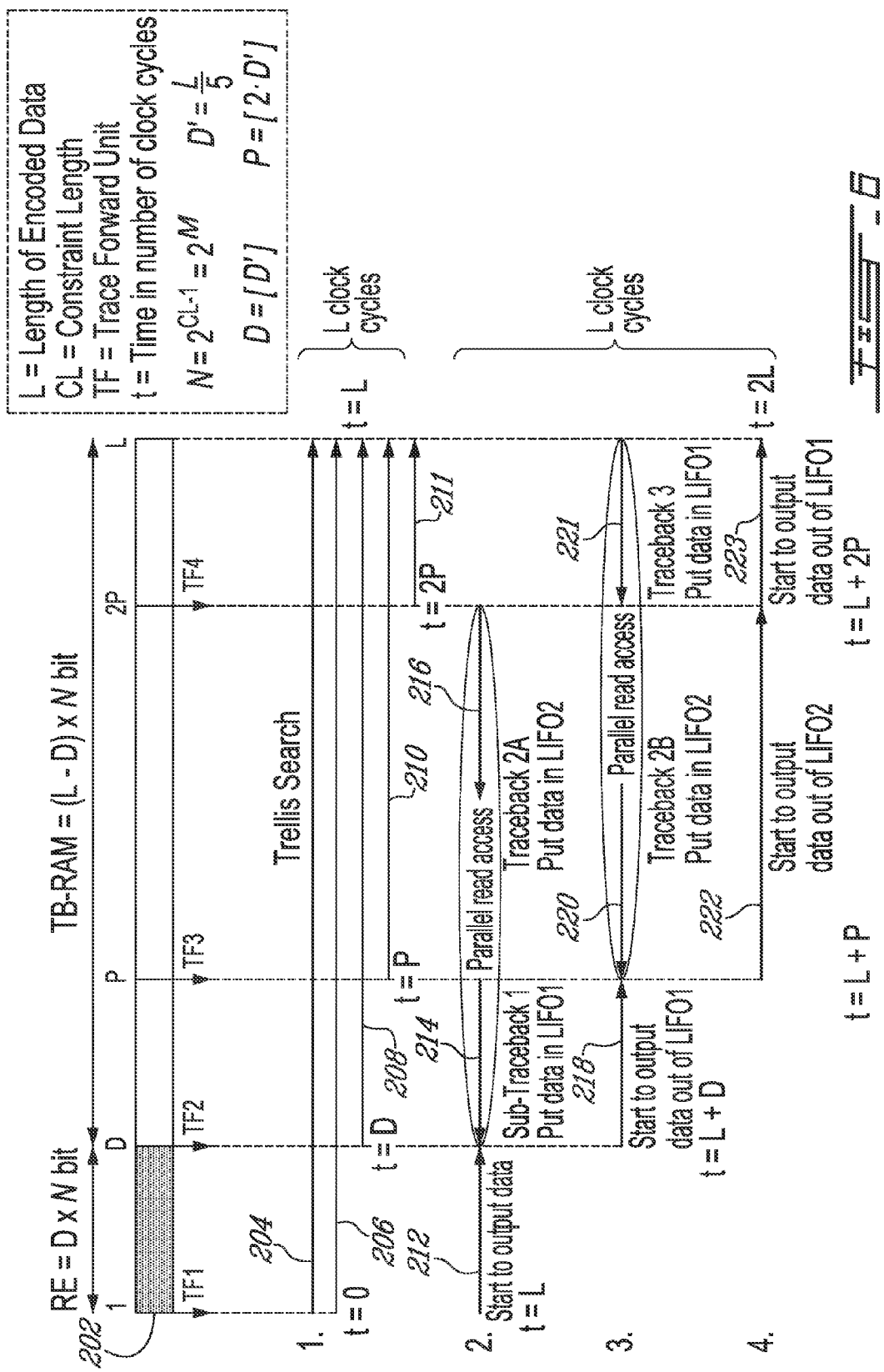

FIG. 6 shows a schematic representation of an embodiment of a system and method according to the disclosure in which D is the rounded-up integer value of D'=L/5. The general architecture of system 100 of FIG. 1 may be used, except that it may be advantageous to add a fourth trace-forward unit TF4, comprising a register of N×M bits. In this embodiment $P=\text{round-up}(2\,D')=\text{round-up}(2L/5)$ At T=0, in the embodiment shown in FIG. 6, trellis search process 204 and tail-biting process 206 commence in parallel, as described above. First, second, and third trace-forward processes 208, 210, 211 commence at T=D, T=P, and T=2 P, as shown. Data relating to third trace-forward process 211 are stored in a TF4 register not shown in FIG. 1 but analogous to registers 108 TF1, TF2, TF3.

At T=L decoded data is output beginning from register 124 using TF2 for the final survivor path starting information. At the same time, trace-back processes 214, 216 can begin, using data from TF3 and TF4, respectively, with output data begin stored in inverse order in LIFO1 and LIFO2, respectively.

At T=L+D, output of first trace-back process begins as data is shifted out from LIFO1 218 and concurrently data of third trace-back process 221 is started to be shifted in into LIFO1 in inverse order. The LIFO is a simple shift register, which can shift data in both directions (shift right or shift left). For each clock cycle all data bits of the shift register are shifted one step further, meaning at each clock cycle one data bit falls out of the register 218 and at the same time one new data bit is inserted to the register chain from the other side 221. In parallel trace-back 2 can continue 220.

At T=L+P, output from LIFO 2 can begin.

At T=L+2 P, output 223 of third trace-back process 221 from LIFO 1 can begin. Again, the total time required for the decoding process is again 2 L clock cycles.

A system 100 adapted for processing according to FIG. 6 can preferably comprise a dual port RAM, as two concurrent sub-trace-backs are employed. Because D in such a case is smaller, register array 124 can be somewhat smaller, to offset the need for a fourth trace-forward unit.

In further embodiments, D=L/6 or even smaller ratios may be used. In such embodiments some increase in hardware complexity should be expected, due for example to the increased numbers of trace-forward units 108 that would be desirable.

Figure 7:
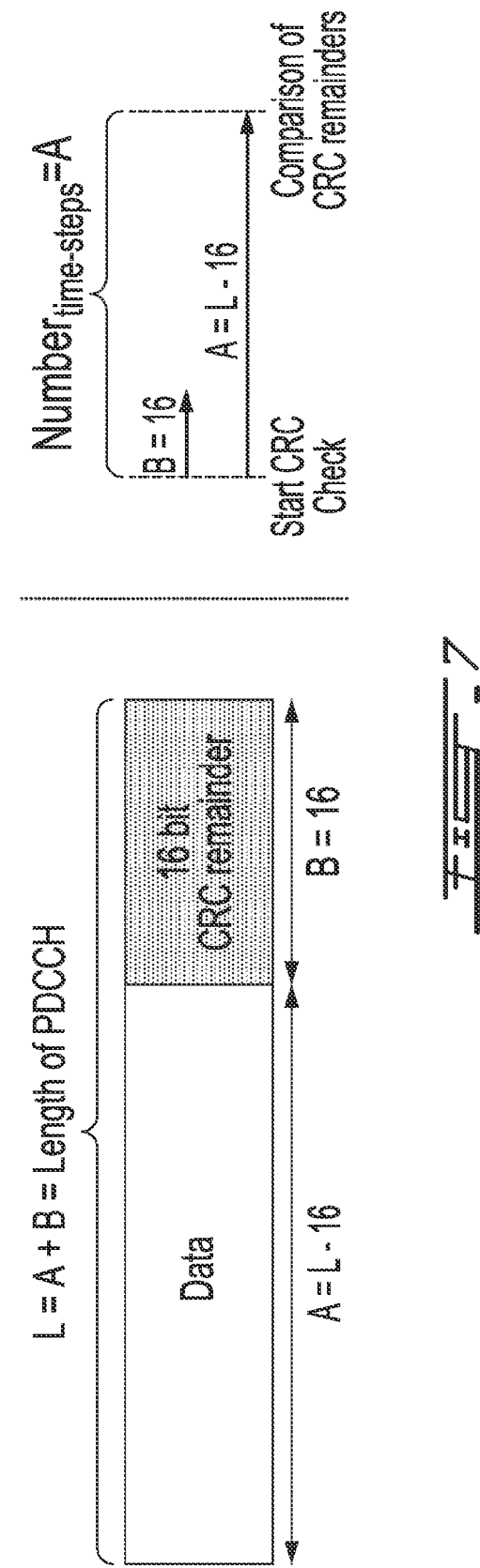
FIG. 7 provides a schematic diagram of a data structure suitable for use in implementing aspects of the disclosure and a schematic diagram of an example of a process suitable for use in implementing aspects of the disclosure.

Among advantages provided by systems and methods according to the disclosure are those which relate to the use in many communication systems of a cyclic redundancy check (CRC). CRC checks are required, for example, in LTE PDCCH detection. As shown in FIG. 7, in typical applications, where for example data records of bit length 70 are employed, the last B=16 bits of each PDCCH data sequence represent the remainder of the CRC check. The first A=L−16 bits are data bits, which may be fed into the CRC check module. As will be understood by those skilled in the relevant arts, such checks may be implemented as a part of, or in conjunction with, other processing performed in and/or by various embodiments of systems and methods disclosed herein.

Using, or otherwise in conjunction with, systems and methods disclosed herein, the overall latency of Viterbi decoding and additional CRC check can be reduced from 2 L to 2 L−B clock cycles (particularly cases in which for A≥B), as it is possible to feed the last B=16 CRC remainder bits into a 16-bit shift register and feed the A data bits into the CRC check module at the same time. For example, after A clock cycles the calculated 16-bit CRC remainder can be immediately compared with the received and decoded CRC remainder in the shift register to decide, whether the data matches or not. For comparison, a simple subtractor can be used. If the output difference of the subtractor is zero the two 16-bit data words are identical.

If A<B, then L−16 clock cycles of latency can be saved in the overall system consisting of Viterbi decoding and additional 16-bit CRC check. If an X-bit CRC check is used, then L−X clock cycles of latency can be saved.

Thus the disclosure provides systems and methods in which a data processor comprising a cyclic redundancy check (CRC) remainder calculation module 130 (see for example FIGS. 9 and 10) configured for calculating CRC remainders for encoded data and a comparator (e.g., a subtraction unit) 132, make cyclic redundancy checks of encoded data records of bit length L, in which at least A bits of the records represent content data and at least B bits represent check data. Methods according to such aspects of the invention comprise: over A clock cycles, using the CRC remainder calculation module 130 to calculate a CRC remainder for the A content bits of the data record; during the same A clock cycles storing the final B bits of decoded trace-back data (representing the transmitted CRC remainder) into a shift register 138; determining, using the comparison of the calculated CRC remainder and the B bits (representing the decoded transmitted CRC remainder), whether the A bits of content data are corrupt or otherwise not properly processable by the system 100 or any its components. In some embodiments of such aspects of the disclosure as noted above, the A bits are the first A bits of the data record, and the B bits are the last B bits of the data record.

Thus the disclosure further provides systems 100 configured to implement such processes. For example, in the embodiment shown in FIG. 9, system 100 comprises CRC remainder calculation module 130 for receiving data record input and processing it as described above, radio network temporary identifier (RNTI) descrambler 134, and comparator (e.g. implemented as a subtraction unit) 132.

Figure 9:
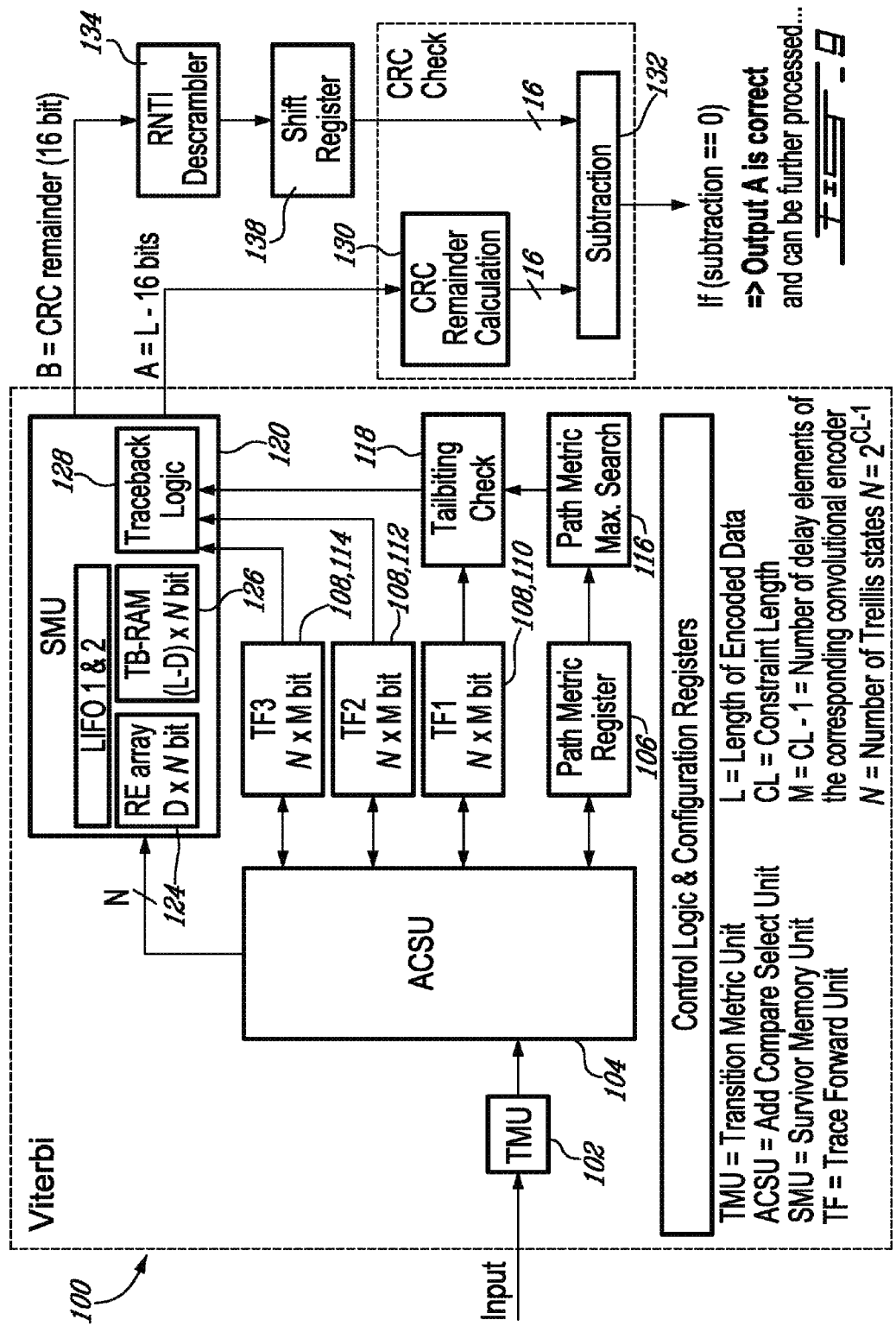
FIGS. 9 and 10 are schematic block diagrams of examples of system architectures suitable for use in implementing aspects of the disclosure.

Using the architecture shown in FIG. 9, for example, CRC checks may be made by providing the first A bits of a decoded data record provided as output by SMU 120 to the CRC remainder calculation module 130 and, in parallel, providing the last B=16 bits of the decoded data record (the CRC check bits) as input to a descrambler 134 initialized with the radio network temporary identifier (RNTI) of the dedicated user equipment. The 16 bits of output from each of modules 130, 134 can be compared by subtraction unit (i.e., comparator) 132. If the output of comparator 132 is zero, then it may be concluded that the output of the SMU 120 is correct. Importantly, the determination whether the output of SMU 120 is correct or incorrect can be made up to B=16 clock cycles faster if A>=B.

Figure 10:
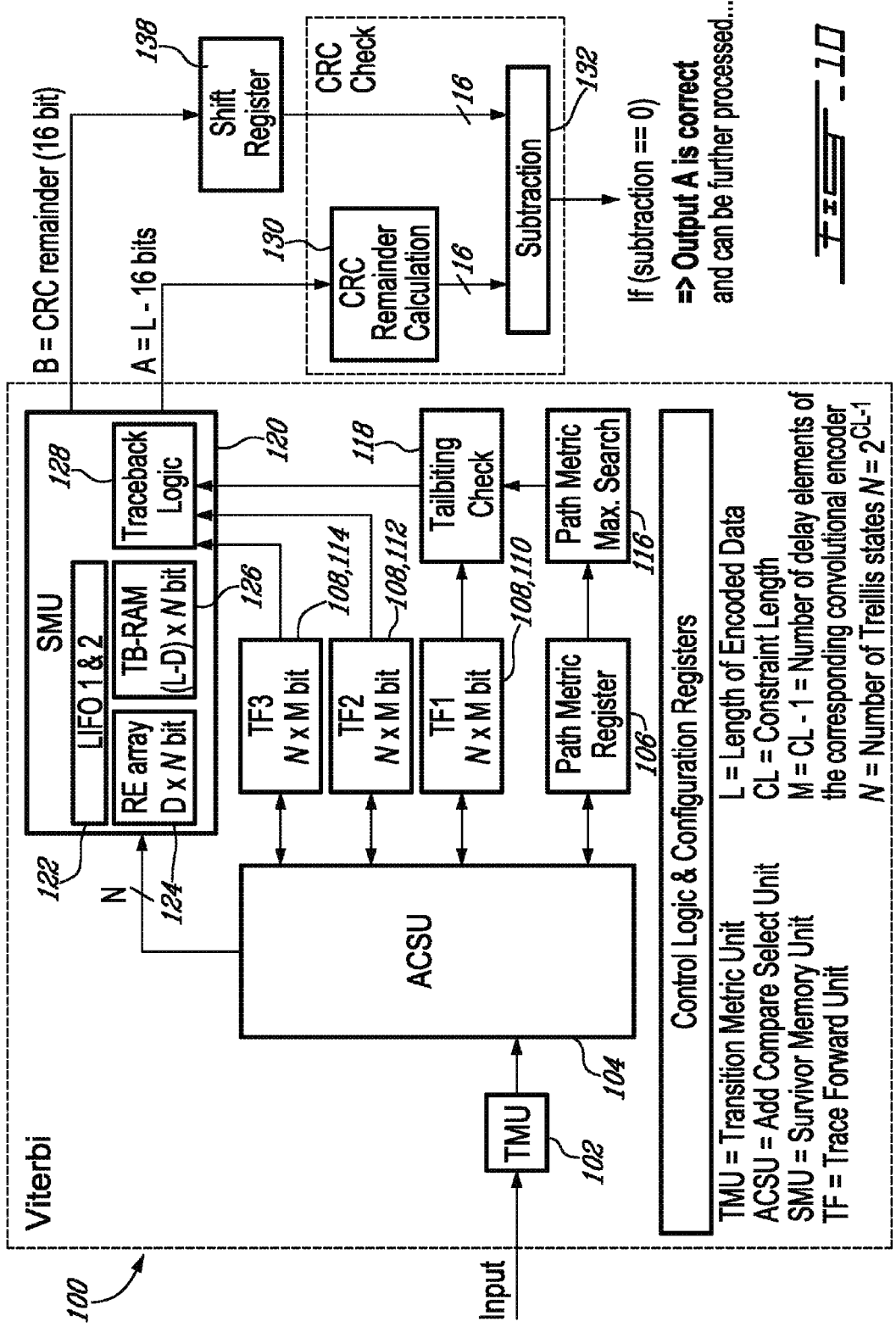

An alternative architecture for CRC checking is shown in FIG. 10. In the architecture shown in FIG. 10, RNTI descrambler module 134 is not required.

The architecture of FIG. 9 can be advantageously used, for example, in processing telecommunications signals according to the LTE standard.

As may be seen, by decoding data from both ends of the decoded output record from SMU 120 concurrently, or otherwise enabling the processing of various portions of a data record of bit length L in parallel, significant improvements in the efficiency and speed of decoding processes can be achieved.

FIG. 11 shows an example of an embodiment of a process for CRC checking according to this aspect invention, using a system architecture such as that shown in FIG. 10, in conjunction with the process described above in connection with FIG. 3. As shown at 264, at T=70 clock cycles during that process, in parallel with initiation of trace-back process 216, the B bits (e.g., 16 bits) of the CRC remainder of a decoded data record can be written to a B-bit shift register. In parallel at time T=70, the first D decoded bits from the register array 124 written at 212 can be input to CRC remainder calculation module 130, at time T=88 the LIFO1 output bits written at 218 can be input to the CRC remainder calculation module 130, at time T=105 the LIFO2 output bits written at 222 can be input to the CRC remainder calculation module 130, and at T=124 a comparison may be made between the output of CRC remainder calculation module 130 and the decoded B-bit CRC remainder stored in the shift register at 264.

Because decoding can be performed in parallel from both ends of the encoded data record, latency of up to B clock cycles can be saved relative to prior art methods of making CRC checks.

With suitable modifications, as will be understood by those skilled in the relevant arts, a process such as that shown in FIG. 11 can be modified for use with an RNTI descrambler 134 or other modules.

While the disclosure has been provided in connection with specific, presently-preferred embodiments, many variations and modifications may be made without departing from the spirit and scope of the invention. The invention is therefore not to be limited to the exact components or details of methodology or construction set forth above. Except to the extent necessary or inherent in the processes themselves, no particular order to steps or stages of methods or processes described in this disclosure, including the Figures, is intended or implied. In many cases the order of process steps may be varied without changing the purpose, effect, or import of the methods described. The scope of the claims is to be defined solely by the appended claims, giving due consideration to the doctrine of equivalents and related doctrines.

What is claimed is:

1. A method, performed by a data processor, for processing electromagnetic signals representing convolutionally encoded data streams, the method comprising:
   while performing a trellis search of a convolutionally encoded data stream of bit length L, where L is an integer:
   storing decision bit data representing results of the trellis search for a first D bits of the convolutionally encoded data stream in a (D×N)-bit register accessible by the data processor, where D is an integer greater than zero and less than L, and ordering the decision bit data according to the results of the trellis search for the first D bits of the convolutionally encoded data stream;
   storing decision bits representing results of the trellis search for a subsequent L-D bits of the convolutionally encoded data stream in random access memory accessible by the data processor; and
   upon completion of the trellis search for the first D bits of the convolutionally encoded data stream, commencing a first trace-forward process of the results of the trellis search, starting with a $(D+1)^{st}$ bit of the convolutionally encoded data stream; and
   commencing at least one trace-back process to decode the stored decision bits in the random access memory corresponding to the $(D+1)^{st}$ through $L^{th}$ bits of the convolutionally encoded data stream, and storing decoded bits determined by the at least one trace-back process in at least one last-in first-out (LIFO) register.

2. The method of claim 1, further comprising:
   upon completion of the trellis search, commencing output of the stored decision bit data corresponding to the first D bits of the convolutionally encoded data stream from the (D×N)-bit register, based on a state position determined by the first trace-forward process at a final winning state position of the trellis search; and
   following output of the stored decision bit data from the (D×N)-bit register, commencing output of the stored decoded bits corresponding to the subsequent L-D bits of the convolutionally encoded data stream from the at least one LIFO register.

3. The method of claim 1, wherein the at least one trace-back process comprises a single trace-back process to decode the stored decision bits in the random access memory corresponding to the $(D+1)^{st}$ through $L^{th}$ bits of the convolutionally encoded data stream commenced starting with a final winning state position of the trellis search.

4. The method of claim 3, further comprising:
   upon completion of the trellis search, commencing output of the stored decision bit data corresponding to the first D bits of the convolutionally encoded data stream from the (D×N)-bit register, based on a state position determined by the first trace-forward process at the final winning state position of the trellis search,
   following output of the stored decision bit data from the (D×N)-bit register, commencing output of the stored decoded bits corresponding to the subsequent L-D bits of the convolutionally encoded data stream from the at least one LIFO register.

5. The method of claim 4, wherein the single trace-back process is commenced in parallel with output of the stored decision bit data from the (D×N)-bit register corresponding to the first D bits of the convolutionally encoded data stream.

6. The method of claim 1, wherein the at least one trace-back process comprises at least two trace-back processes to decode the stored decision bits in the random access memory corresponding to the $(D+1)^{st}$ through $L^{th}$ bits of the convolutionally encoded data stream, including one trace-back process commenced starting with the final winning state position of the trellis search and at least one other trace-back process commenced starting with a state position determined by a trace-forward process other than the first trace-forward process at the final winning state position of the trellis search.

7. The method of claim 6, further comprising:
   upon completion of the trellis search, commencing output of the stored decision bit data corresponding to the first D bits of the convolutionally encoded data stream from the (D×N)-bit register, based on a state position determined by the first trace-forward process at the final winning state position of the trellis search,
   following output of the stored decision bit data from the (D×N)-bit register, commencing output of the stored decoded bits corresponding to the subsequent L-D bits of the convolutionally encoded data stream from the at least one LIFO register.

8. The method of claim 6, further comprising:
   upon completion of the trellis search for a first P bits of the convolutionally encoded data stream, where P is an integer greater than D and less than L, commencing a second trace-forward process, starting with a $(P+1)^{st}$ bit of the convolutionally encoded data stream.

9. The method of claim 8, further comprising:
   commencing a first trace-back process for the decision bits stored in the random access memory corresponding to the $(D+1)^{st}$ through $P^{th}$ bits of the convolutionally encoded data stream, starting with a state position determined by the second trace-forward process at the final winning state position of the trellis search; and
   commencing a second trace-back process for the decision bits stored in the random access memory corresponding to the $(P+1)^{st}$ through $L^{th}$ bits of the convolutionally encoded data stream, starting with the final winning state position of the trellis search.

10. The method of claim 9, wherein the first trace-back process and at least a portion of the second trace-back are performed in parallel.

11. The method of claim 8, further comprising:
   upon completion of the trellis search for a first 2P bits of the convolutionally encoded data stream, where 2P is an integer greater than P and less than L, commencing a third trace-forward process, starting with a $(2P+1)^{st}$ bit of the convolutionally encoded data stream.

12. The method of claim 11, further comprising:
commencing a first trace-back process for the decision bits stored in the random access memory corresponding to the $(D+1)^{st}$ through $P^{th}$ bits of the convolutionally encoded data stream, starting with a state position determined by the second trace-forward process at the final winning state position of the trellis search;
commencing a second trace-back process for the decision bits stored in the random access memory corresponding to the $(P+1)^{st}$ through $2P^{th}$ bits of the convolutionally encoded data stream, starting with a state position determined by the third trace-forward process at the final winning state position of the trellis search; and
commencing a third trace-back process for the decision bits stored in the random access memory corresponding to the $(2P+1)^{st}$ through $L^{th}$ bits of the convolutionally encoded data stream, starting with the final winning state position of the trellis search.

13. The method of claim 12, wherein the first trace-back process and at least a portion of the second trace-back are performed in parallel.

14. The method of claim 6, further comprising:
upon completion of the trellis search for a first P bits of the convolutionally encoded data stream, where P is an integer greater than D and less than L, commencing a second trace-forward process, starting with a $(P+1)^{st}$ bit of the convolutionally encoded data stream;
in parallel with outputting of the decision bit data from the (D×N)-bit register, commencing a first trace-back process for the decision bits stored in the random access memory corresponding to the $(D+1)^{st}$ through $P^{th}$ bits of the convolutionally encoded data stream, starting with a state position determined by the second trace-forward process at the final winning state position of the trellis search, and storing decoded bits determined by the first trace-back process in a first LIFO register;
following output of the stored decision bit data from the (D×N)-bit register, commencing output of the decoded bits stored in the first LIFO register corresponding to the $(D+1)^{st}$ through $P^{th}$ bits of the convolutionally encoded data stream;
commencing a second trace-back process for the decision bits stored in the random access memory corresponding to the $(P+1)^{st}$ through $L^{th}$ bits of the convolutionally encoded data stream, starting with the final winning state position of the trellis search, and storing decoded bits determined by the second trace-back process in a second LIFO register; and
following output of the stored decoded bits in the first LIFO register, commencing output of the decoded bits stored in the second LIFO register corresponding to the $(P+1)^{st}$ through $L^{th}$ bits of the convolutionally encoded data stream.

15. The method of claim 6, further comprising:
upon completion of the trellis search for a first P bits of the convolutionally encoded data stream, where P is an integer greater than D and less than L, commencing a second trace-forward process, starting with a $(P+1)^{st}$ bit of the convolutionally encoded data stream;
in parallel with outputting of the decision bit data from the (D×N)-bit register:
commencing a first trace-back process for the decision bits stored in the random access memory corresponding to the $(D+1)^{st}$ through $P^{th}$ bits of the convolutionally encoded data stream, starting with a state position determined by the second trace-forward process at the final winning state position of the trellis search, and storing decoded bits determined by the first trace-back process in a first LIFO register; and
commencing a second trace-back process for the decision bits stored in the random access memory corresponding to the $(P+1)^{st}$ through $L^{th}$ bits of the convolutionally encoded data stream, starting with the final winning state position of the trellis search, and storing decoded bits determined by the second trace-back process in a second LIFO register;
following output of the stored decision bit data from the (D×N)-bit register, commencing output of the decoded bits stored in the first LIFO register corresponding to the $(D+1)^{st}$ through $P^{th}$ bits of the convolutionally encoded data stream; and
following output of the stored decoded bits in the first LIFO register, commencing output of the decoded bits stored in the second LIFO register corresponding to the $(P+1)^{st}$ through $L^{th}$ bits of the convolutionally encoded data stream.

16. The method of claim 6, further comprising
upon completion of the trellis search for a first P bits of the convolutionally encoded data stream, where P is an integer greater than D and less than L, commencing a second trace-forward process, starting with a $(P+1)^{st}$ bit of the convolutionally encoded data stream;
upon completion of the trellis search for a first 2P bits of the convolutionally encoded data stream, where 2P is an integer greater than P and less than L, commencing a third trace-forward process, starting with a $(2P+1)^{st}$ bit of the convolutionally encoded data stream;
in parallel with outputting of the decision bit data from the (D×N)-bit register:
commencing a first trace-back process for the decision bits stored in the random access memory corresponding to the $(D+1)^{st}$ through $P^{th}$ bits of the convolutionally encoded data stream, starting with a state position determined by the second trace-forward process at the final winning state position of the trellis search, and storing decoded bits determined by the first trace-back process in a first LIFO register; and
commencing a second trace-back process for the decision bits stored in the random access memory corresponding to the $(P+1)^{st}$ through $2P^{th}$ bits of the convolutionally encoded data stream, starting with a state position determined by the third trace-forward process at the final winning state position of the trellis search, and storing decoded bits determined by the first trace-back process in a second LIFO register;
following output of the stored decision bit data from the (D×N)-bit register, commencing output of the decoded bits stored in the first LIFO register corresponding to the $(D+1)^{st}$ through $P^{th}$ bits of the convolutionally encoded data stream;
following output of the stored decoded bits in the first LIFO register, commencing output of the decoded bits stored in the second LIFO register corresponding to the $(P+1)^{st}$ through $2P^{th}$ bits of the convolutionally encoded data stream;
commencing a third trace-back process for the decision bits stored in the random access memory corresponding to the $(2P+1)^{st}$ through $L^{th}$ bits of the convolutionally encoded data stream, starting with the final winning state position of the trellis search, and storing decoded bits determined by the third trace-back process in the first LIFO register array; and
following output of the stored decoded bits in the second LIFO register, commencing output of the decoded bits stored in the first LIFO register corresponding to the $(2P+1)^{st}$ through $L^{th}$ bits of the convolutionally encoded data stream.

17. The method of claim 1, wherein:

$D$=round-up($D'$);

$L/5 \leq D' \leq L/2$;

$M = CL-1$;

$N = 2^M = 2^{(CL-1)}$;

CL=the constraint length of a convolutional encoder used to generate the convolutionally encoded data stream; and M=the number of delay elements of the convolutional encoder.

18. A system for processing electromagnetic signals representing convolutionally encoded data streams, the system comprising:
   at least one processor configured to execute a trellis search of one or more convolutionally encoded data streams of bit length L, where L is an integer;
   a (D×N)-bit data register for storage of decision bit data representing results of the trellis search provided by the at least one processor for a first D bits of each corresponding data stream, where D is an integer greater than zero and less than L, and the decision bit data stored in the (D×N)-bit data register re-orderable by the at least one processor according to the results of the trellis search for the first D bits of each corresponding data stream;
   a memory store configured for storage of decision bits representing results of the trellis search provided by the at least one processor for a subsequent L−D bits of each corresponding data stream;
   at least one (N×M)-bit trace-forward register for storage of trace-forward data provided by the at least one processor; and
   a trace-back logic unit configured to perform at least one trace-back process to decode the stored decision bits in the memory store.

19. The system of claim 18, wherein the at least one processor is configured to output the stored decision bit data from the (D×N)-bit data register based on the trace-forward data stored in the at least one (N×M)-bit trace-forward register.

20. The system of claim 19, further comprising at least one last-in first-out (LIFO) register for temporary storage of decision bits outputted from the memory store.

21. The system of claim 18, wherein the trace-back unit is configured to perform a single trace-back process to decode the stored decision bits in the memory store commenced starting with a final winning state position of the trellis search.

22. The system of claim 18, wherein the trace-back unit is configured to perform at least two trace-back processes to decode the stored decision bits in the memory store, including one trace-back process commenced starting with the final winning state position of the trellis search, and at least one other trace-back process commenced starting with a state position determined from the trace-forward data stored in the at least one (N×M)-bit trace-forward register.

23. The system of claim 22, wherein the at least one (N×M)-bit trace-forward register comprises at least two (N×M)-bit trace-forward registers, including a first trace-forward register for storage of trace-forward data used to output the stored decision bit data from the (D×N)-bit data register, and at least a second trace-forward register for storage of trace-forward data used by the trace-back unit to decode the stored decision bits in the memory store.

24. The system of claim 23, wherein the at least one (N×M)-bit trace-forward register further comprises a third trace-forward register for storage of trace-forward data used by the trace-back unit to decode the stored decision bits in the memory store.

25. The system of claim 18, wherein:

$D$=round-up($D'$);

$L/5 \leq D' \leq L/2$;

$M = CL-1$;

$N = 2^M = 2^{(CL-1)}$;

CL=the constraint length of a convolutional encoder used to generate the one or more convolutionally encoded data streams; and M=the number of delay elements of the convolutional encoder.

* * * * *